(12) United States Patent
Pasino

(10) Patent No.: US 8,127,902 B2
(45) Date of Patent: Mar. 6, 2012

(54) ANNULAR SEALING ASSEMBLY FOR INSERTION BETWEEN TWO MECHANICAL MEMBERS IN RELATIVE MOTION, IN PARTICULAR A LINEAR RECIPROCATING MOTION, AS A ROD AND THE RELATIVE GUIDING SEAT OF A MONO-TUBE SHOCK-ABSORBER

(75) Inventor: Roberto Pasino, Castellero (IT)

(73) Assignee: Aktiebolaget KSF, Gothenburg (SE)

( * ) Notice: Subject to any disclaimer, the term of this patent is extended or adjusted under 35 U.S.C. 154(b) by 1024 days.

(21) Appl. No.: 12/005,418

(22) Filed: Dec. 26, 2007

(65) Prior Publication Data

US 2008/0221839 A1 Sep. 11, 2008

(30) Foreign Application Priority Data

Dec. 29, 2006 (EP) .................................... 06425875

(51) Int. Cl.
*F16F 9/36* (2006.01)
(52) U.S. Cl. .............. 188/322.17; 188/322.16; 277/551; 277/553; 277/562; 277/572; 277/574; 92/165 R; 92/168
(58) Field of Classification Search ............. 188/322.16, 188/322.17; 277/309, 353, 394, 500, 549, 277/564, 565, 572, 551, 553, 562, 574; 267/129, 267/220; 92/168, 165 R
See application file for complete search history.

(56) References Cited

U.S. PATENT DOCUMENTS 4,055,352 A * 10/1977 Allinquant et al. ........... 277/558
(Continued)

FOREIGN PATENT DOCUMENTS

DE        82 01 327        5/1982
(Continued)

OTHER PUBLICATIONS

English Abstract of DE 44 32 305 dated Mar. 21, 1996.
(Continued)

*Primary Examiner* — Robert Siconolfi
*Assistant Examiner* — Mariano Sy
(74) *Attorney, Agent, or Firm* — Ladas & Parry LLP

(57) ABSTRACT

A sealing assembly including a sealing ring made of elastomeric material and having, integrally in one piece, at least one elastically deformable, annular sealing lip, at least part of which projects axially from and radially inwards of the sealing ring, from a respective root portion adjacent to a first axial end of the sealing ring, and towards a second axial end, opposite the first, of the sealing ring; and an annular reinforcing structure made of material which is elastically deformable but relatively much more rigid than the elastomeric material of the sealing ring and relative lip, and at least partly embedded in the sealing ring; wherein the reinforcing structure extends at least partly in an axial direction, at least partly alongside but on the opposite side to the sealing lip; the sealing lip being designed to define, when undeformed, a predetermined radial clearance between itself and a radially inner lateral wall of the sealing ring.

17 Claims, 5 Drawing Sheets

U.S. PATENT DOCUMENTS

| | | | |
|---|---|---|---|
| 4,278,261 A * | 7/1981 | Miura et al. | 277/574 |
| 4,508,020 A * | 4/1985 | Szcupak | 277/353 |
| 4,880,087 A * | 11/1989 | Janes | 188/322.16 |
| 5,167,419 A * | 12/1992 | Robertson | 277/552 |
| 5,246,092 A * | 9/1993 | Yamaoka | 188/315 |
| 5,597,356 A | 1/1997 | Rieder | |
| 5,664,651 A * | 9/1997 | Miura et al. | 188/322.17 |
| 6,158,559 A * | 12/2000 | Asa et al. | 188/322.17 |
| 6,318,526 B1 | 11/2001 | Kruckemeyer et al. | |
| 6,612,582 B2 * | 9/2003 | Hosoda | 277/436 |
| 6,659,243 B2 * | 12/2003 | Yasuda | 188/322.17 |
| 6,659,470 B2 * | 12/2003 | Hosoda et al. | 277/560 |

FOREIGN PATENT DOCUMENTS

| | | |
|---|---|---|
| DE | 44 32 305 | 3/1996 |
| EP | 1 074 760 | 11/2004 |
| JP | 2001-304324 | 10/2001 |
| JP | 2006-275098 | 10/2006 |

OTHER PUBLICATIONS

Patent Abstracts of Japan of JP 2001-304324 dated Oct. 31, 2001.
Patent Abstracts of Japan of JP 2006-275098 dated Oct. 12, 2006.

* cited by examiner ns
ANNULAR SEALING ASSEMBLY FOR INSERTION BETWEEN TWO MECHANICAL MEMBERS IN RELATIVE MOTION, IN PARTICULAR A LINEAR RECIPROCATING MOTION, AS A ROD AND THE RELATIVE GUIDING SEAT OF A MONO-TUBE SHOCK-ABSORBER The present invention relates to an annular sealing assembly of the type inserted between two mechanical members in relative motion, in particular a linear reciprocating motion, as a rod and relative guide seat of a "mono-tube" or "one-pipe" shock absorber.

BACKGROUND OF THE INVENTION

One-pipe hydraulic shock absorbers, widely used in the automotive and other industries, operate under relatively high hydraulic pressures, on average about 20 bars, with peaks of as high as 100 bars. To cope with such high operating pressures, sealing of the pressurized oil opposing the shock absorber piston—sealing which takes place between the shock absorber rod and the rod guide seat normally formed through a bush fitted in fluidtight manner inside the shock absorber body—is performed by a sealing assembly of the type shown in FIG. 1, which comprises at least three members: a conical rubber pad A fitted to a bush T and having a sealing lip, which pad constitutes the actual sealing member sliding, in use, on the shock absorber rod; a lock washer B on bush T, this latter being inserted in fluidtight manner inside a body S defined by a one-wall pipe; and a contrasting member C interposed between rubber pad A and washer B. Normally, bush T is also provided with a guiding liner R providing the sliding seat for the rod.

Known sealing assemblies of the type shown in FIG. 1 are however not completely satisfactory, by being relatively bulky and relatively complicated to assemble on account of the number of connected parts involved, and by having worsening performances with temperature decreasing. The rubber pad A, in particular, is currently made of a special fluorocarbon synthetic elastomer known as FKM, which has a minimum operating temperature of minus 15° C., whereas current applications call for a minimum operating temperature of minus 40° C.

EP1074760B1 describes a shock absorber rod sealing assembly specially designed to withstand fatigue stress and so operate effectively for a relatively long period of time. The sealing assembly described in EP1074760B1, however, is only suitable for so-called two-pipe shock absorbers designed to operate at relatively low pressures, on average 5 to 15 bars, and in which fall-off in performance at very low temperatures is less of a problem.

SUMMARY OF THE INVENTION

It is an object of the present invention to provide a sealing assembly for insertion between two mechanical members in relative motion, particularly but not exclusively a linear reciprocating motion, as a rod and relative guide seat of a shock absorber, designed to eliminate the drawbacks of the known art, and which, in particular, is specifically designed for use in one-pipe shock absorbers and anyway between organs operating at very low temperatures, well below minus 15° C., and more generally in a wide range of temperatures, e.g. between −40° C. and +200° C.

In particular, it is an object of the invention to provide a sealing assembly of the above type, which also performs excellently at very low temperature, is extremely easy to assemble, is cheap to produce and assemble, and is compact.

According to the present invention, there is provided a sealing assembly for insertion between two members in relative motion when in use, in particular linear motion like a rod and relative guide seat of a one-pipe shock absorber, as claimed in the attached claims.

More specifically, the sealing assembly according to the invention comprises a sealing ring made of elastomeric material and having, integrally in one piece, at least one elastically deformable, annular sealing lip, at least part of which projects axially from and radially inwards of the sealing ring, from a respective root portion immediately adjacent to a first axial end of the sealing ring, and towards a second axial end, opposite the first, of the sealing ring; and an annular reinforcing structure made of material which is at least partly elastically deformable but relatively much more rigid than the elastomeric material of the sealing ring and the sealing lip, the reinforcing structure being at least partly embedded in the sealing ring.

According to one aspect of the invention, the reinforcing structure extends at least partly in an axial direction, at least partly alongside but on the opposite side to the sealing lip, and the sealing lip is designed to define, when undeformed, a predetermined radial clearance between itself and a radially inner lateral wall of the sealing ring.

The reinforcing structure comprises a sleeve portion extending axially from the second axial end of the sealing ring towards the first, and which terminates substantially at the root portion of the sealing lip, so that the root portion and the first end of the sealing ring have no reinforcing structure. The sleeve portion may be either completely embedded in the sealing ring, or only partly embedded in it to define at least part of its radially inner lateral wall.

The reinforcing structure preferably has a substantially L-shaped radial section, and also comprises a flange portion, which extends radially, on the opposite side to the radially inner lateral wall of the sealing ring, from a first end of the sleeve portion flush with said first axial end of the sealing ring. The flange portion of the reinforcing structure is not embedded in the sealing ring, and may project radially from, and substantially flush with, the first axial end of the sealing ring to define radially, on the outside of the sealing ring, an annular axial shoulder by which to assemble the sealing assembly.

The sleeve portion of the reinforcing structure thus cooperates elastically, in use, with the sealing lip, on the one hand to limit maximum radial deformation of the sealing lip, and, on the other, to provide mechanical support which, by virtue of the geometry adopted, surprisingly prevents the fall-off in performance, typical of known sealing assemblies for one-pipe shock absorbers of the type shown in FIG. 1, at very low operating temperatures below minus 15° C.

At the same time, using the same mix for the sealing lip (FKM), performance in not particularly low temperature conditions remains substantially unchanged, and, above all, the sealing assembly is much more compact, both axially and radially, and much easier to assemble, thus enabling considerable saving.

Finally, the sealing assembly according to the invention may be used, together with a shock absorber rod guide bush, to form a preassembled unit that can be fitted to the shock absorber body in one operation.

At this purpose, the sealing assembly of the invention is locked axially inside a cup-shaped seat portion of the guide bush by snap-on fitting it on said bush in a fluid-tight manner by means of a flat portion of the sealing ring extending radially from the second end thereof and terminating with an outermost radially peripheral thicker edge shaped like an o-ring and extending axially in cantilever fashion from the flat portion on a side facing said first end of the sealing ring and in such a manner to be able to cooperate in use in a fluid-tight manner with a lateral wall of the shock adsorber body.

In this manner a further and dramatic reduction of the axial bulk of the unit formed by the guide bush and the sealing assembly is obtained.

BRIEF DESCRIPTION OF THE DRAWINGS

A number of non-limiting embodiments of the present invention will be described by way of example with reference to the accompanying drawings, in which.

DETAILED DESCRIPTION OF THE INVENTION

Figure 1:
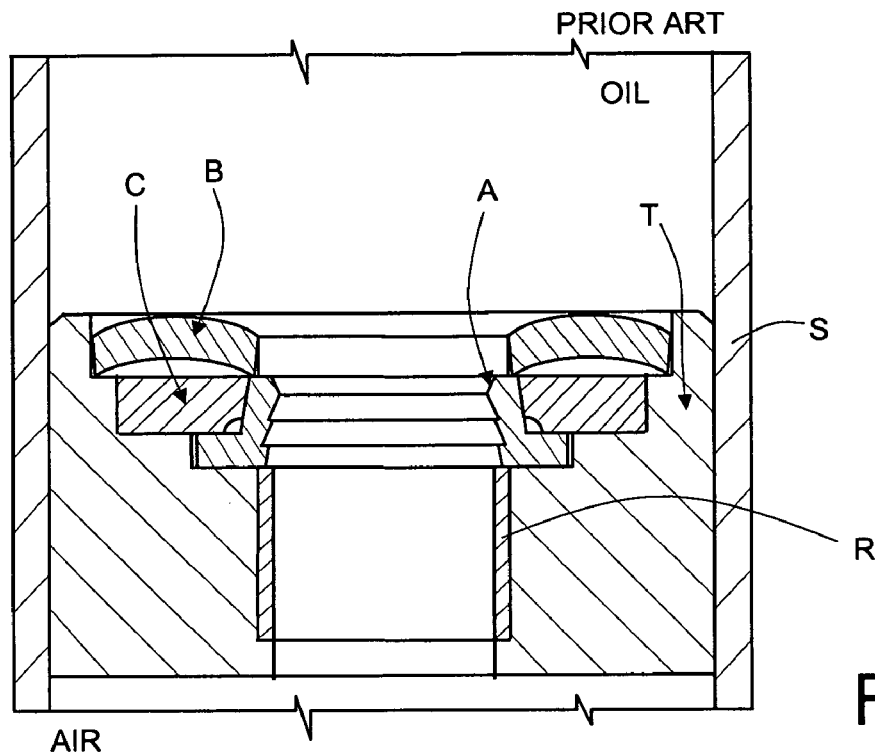
FIG. 1 shows a schematic side view in radial section of a portion of a shock absorber fitted with a known rod seal.
Figure 2:
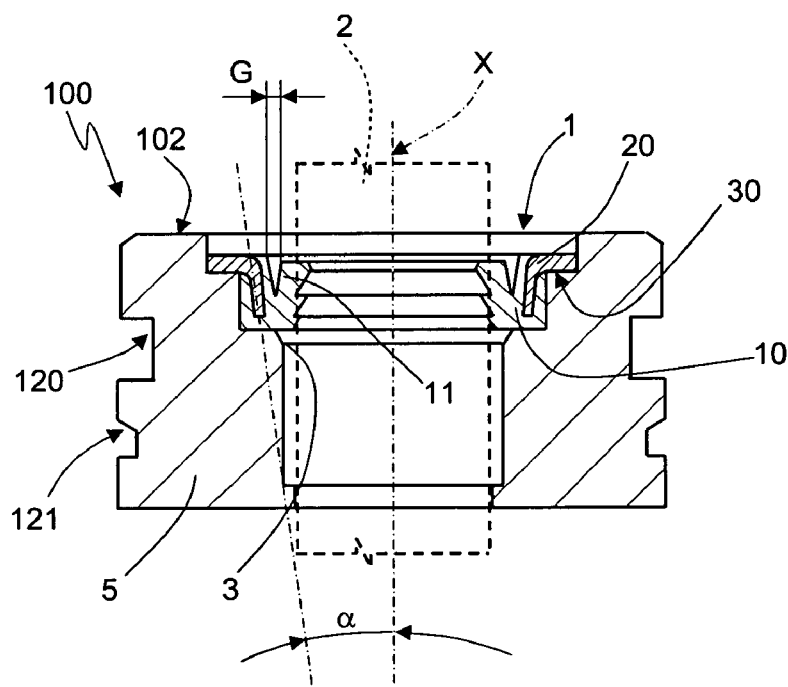
FIG. 2 shows a schematic side view in radial section of a shock absorber rod sealing and guide unit incorporating a sealing assembly in accordance with the invention.
Figure 3:
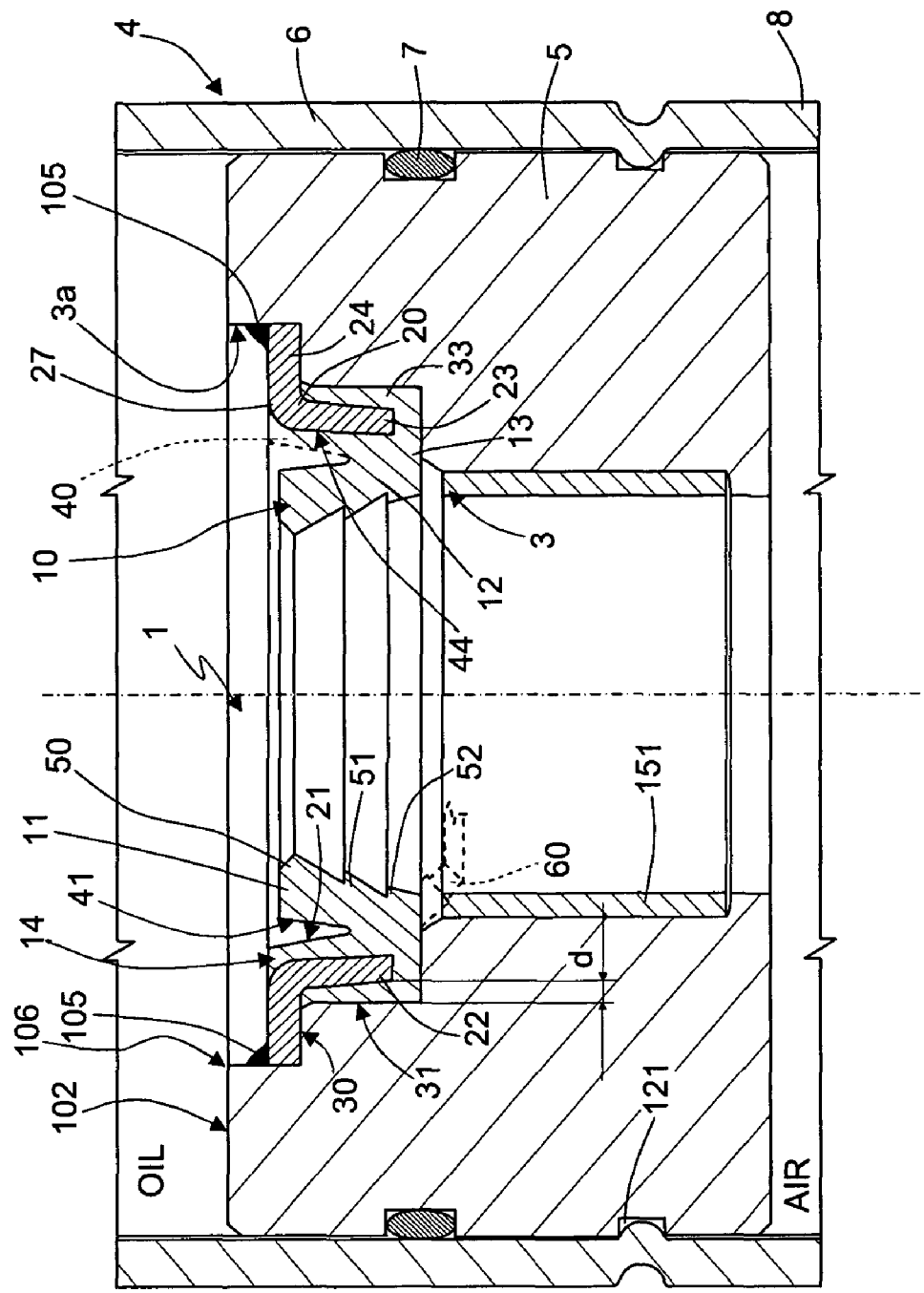
FIG. 3 shows a larger-scale, schematic side view in radial section of a shock absorber fitted with the FIG. 2 sealing and guide unit.

Number 1 in FIGS. 2 and 3 indicates a sealing assembly for insertion between two mechanical members which are in relative motion under normal operative conditions; in the non limiting embodiment illustrated, the mechanical members are subject to a linear reciprocating motion and in particular consist in a shock absorber rod 2 and a relative guide seat 3 of a one-pipe shock absorber 4, only an end portion of which is shown in FIG. 3. Seat 3 is formed in known manner through a substantially known bush 5, which is driven, in use, in fluidtight manner inside a body 6 of shock absorber 4, e.g. by means of a sealing ring 7 and by riveting or caulking an end 8 of one-pipe body 6 of shock absorber 4 in known manner to bush 5, e.g. inside an annular outermost radial groove 121 of bush 5. The latter is also provided with a radially innermost known guiding liner 151 for rod 2 also having anti-friction capacity, lining the inner side of guide seat 3.

Sealing assembly 1 (FIG. 3) is axially symmetrical about an axis X (FIG. 2), and comprises a sealing ring 10 made of elastomeric material and having, integrally in one piece, at least one elastically deformable, annular sealing lip 11, at least part of which projects axially from and radially inwards of sealing ring 10, from a respective root portion 12 immediately adjacent to a first axial end 13 of sealing ring 10, and towards a second axial end 14, opposite end 13, of sealing ring 10.

Sealing assembly 1 also comprises an annular reinforcing structure 20 made of material which is at least partly elastically deformable but relatively much more rigid than the elastomeric material of sealing ring 10 and relative sealing lip 11. More specifically, whereas ring 10 and relative lip 11 are preferably made of a fluorocarbon elastomeric mix, typically FKM, reinforcing structure 20 is preferably made of metal, e.g. sheet steel or appropriately coined copper alloy sheet, or of appropriate non-elastomeric synthetic plastic material, possibly chemically compatible with the elastomeric material of sealing ring 10.

Reinforcing structure 20 is at least partly embedded in sealing ring 10, and at any rate is chemically and mechanically bonded in known manner to the sealing ring at the curing stage. According to one characteristic of the invention, reinforcing structure 20 extends at least partly in an axial direction, at least partly alongside but on the opposite side to sealing lip 11; and, in combination with the above characteristic, lip 11 is designed to define, when undeformed (i.e. when not cooperating with rod 2, to which, in use, it is fitted with radial interference, as shown schematically out of scale and in dot lines in FIG. 2), a predetermined radial clearance G (FIG. 2) between itself and a radially inner lateral wall 21 of sealing ring 10.

More specifically, reinforcing structure 20 comprises a sleeve portion 22 extending axially from second axial end 14 of sealing ring 10 towards first end 13, and which terminates substantially at root portion 12, so that root portion 12 and end 13 of sealing ring 10 have no reinforcing structure 20, but are located close to an end 23, opposite end 14, of sleeve portion 22.

Reinforcing structure 20 preferably has a substantially L-shaped radial section, and comprises, in addition to sleeve portion 22, a flange portion 24, which extends radially, on the opposite side to radially inner lateral wall 21 of sealing ring 10, from an end 27 of sleeve portion 22 flush with axial end 14 of sealing ring 10 and opposite end 23.

In the non-limiting example shown, flange portion 24 of reinforcing structure 20 is not embedded in sealing ring 10, and projects radially from, and substantially flush with, axial end 14 to define radially, on the outside of sealing ring 10, an annular axial shoulder 30 by which to assemble sealing assembly 1 inside seat 3.

Sealing ring 10 also comprises a radially outer lateral wall 31 located a predetermined radial distance "d" from sleeve portion 22, so as to define, with sleeve portion 22 and axial end 13 of sealing ring 10, a static sealing portion 33 of the sealing ring. Static sealing portion 33 is interference-fitted, in use, to a seat portion 3a of seat 3; seat portion 3a is cup-shaped to house sealing assembly 1, in use, and is formed in a first of said members in relative linear motion, in this case, bush 5.

As shown on the left of FIG. 3, sleeve portion 22 of reinforcing structure 20 extends alongside radially inner lateral wall 21 of sealing ring 10, and is embedded completely in sealing ring 10.

Conversely, in a variation shown by the dash line on the right of FIG. 3, a radially inner annular portion 40 of sealing ring 10 facing lip 11—in particular, facing a radially outer lateral surface 41 of lip 11—may be eliminated, so that at least part of a radially inner surface 44 of sleeve portion 22 is not embedded in sealing ring 10, and at least partly defines radially inner lateral wall 21 of sealing ring 10.

In the first case, radial clearance G will be defined between surface 41 and lateral wall 21, and, in the second case, between surface 41 and surface 44.

Preferably, sleeve portion 22 of reinforcing structure 20 is slightly conically symmetrical, tapering towards first axial end 13 of sealing ring 10 to form an angle α (FIG. 2) with axis X; and, in radial section, annular sealing lip 11 also slopes slightly away from lateral wall 21 towards axial end 14 of sealing ring 10, and gets thinner in radial thickness towards root portion 12.

More specifically, annular sealing lip 11 projects axially from first axial end 13 of sealing ring 10 by such a length as to terminate just short of the opposite second axial end 14 of sealing ring 10, and has a number of radially inner sealing edges 50, 51, 52, which, in radial section, are serrated in shape and decrease in size towards root portion 12.

Sealing ring 10 may comprise a second elastically deformable sealing lip 60 (shown by the dash line in FIG. 3) in the form of a dust lip, and which projects axially from first axial end 13 of sealing ring 10, on the opposite side to axial end 14.

So equipped, sealing assembly 1 according to the invention can be preassembled inside seat 3 in bush 5 to form a hydraulic sealing and guide unit 100 (FIG. 2) for rod 2 of one-pipe shock absorber 4. Unit 100 therefore comprises guide bush 5 of rod 2, which is fixed, in use, in fluidtight manner to an inner lateral wall of body 6 of shock absorber 4; and sealing assembly 1, as described above, which is fitted inside the cup-shaped portion 3a of seat 3 formed in a first end 102 of bush 5 facing inwards of shock absorber body 6 in use, and is preferably locked axially inside cup-shaped seat portion 3a by crimped portions 105 of a peripheral edge 106 of cup-shaped seat portion 3a facing first end 102 of bush 5.

Unit 100 is completed with a sealing ring 7 housed inside an annular groove 120 formed radially on the outside of bush 5; and internally, by a guiding liner 151 for rod 2.

Figure 4:
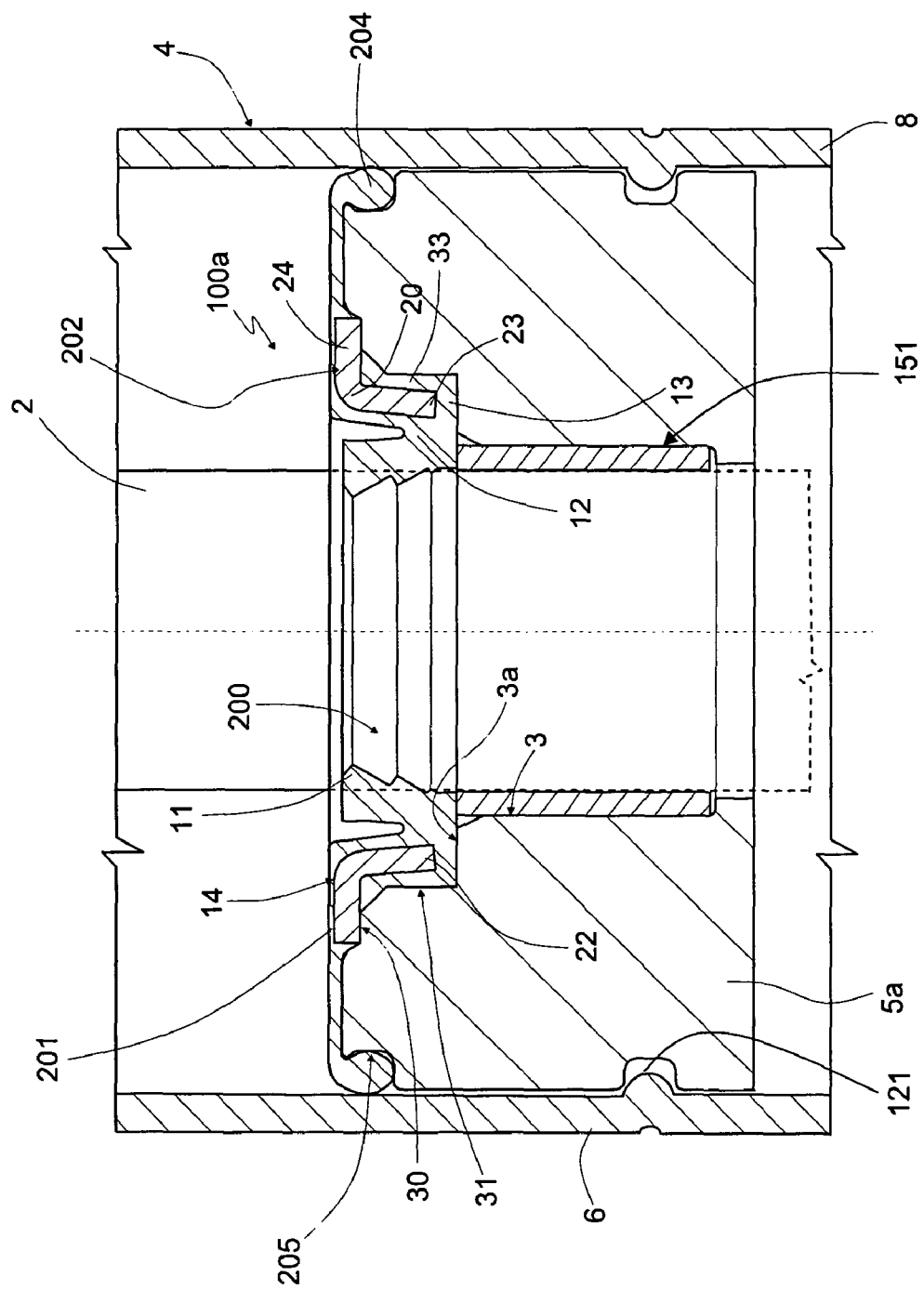
FIG. 4, shows schematically the same side view of the shock absorber of FIG. 3, but fitted with a preferred, further possible embodiment of the sealing assembly of FIG. 2.

Referring now to FIG. 4, where details similar or identical to those as already described are indicated by the same reference numbers, it is indicated with reference number 200 a different and preferred embodiment of the sealing unit of the invention, shown assembled on a bush 5a in place of sealing unit 1 previously described to form a sealing and guiding unit 100a, like as already described for sealing assembly 1.

Contrary to what shown for sealing assembly 1, sealing assembly 200 is snap-on fitted on bush 5a in a fluid-tight manner owing to a flat portion 201 of sealing ring 10 which extends radially from end 14 and upon a frontal surface 202 of flange portion 24, so covering surface 202, which faces opposite to axial shoulder 30, accordingly partially embedding flange portion 24 in sealing ring 10.

Flat portion 201 ends in fact with an outermost radially peripheral thicker edge 204 shaped like an o-ring and extending axially in cantilever fashion from flat portion 201 on the side opposite to surface 202, i.e. on the side facing end 13; o-ring shaped edge 204 is in particular shaped so as to be able to fluid tight fit in use, on its radially outer side, with the inner surface of lateral wall of body 6 of shock adsorber 4 and, on its radially inner side, with an annular seat 205 having a substantially semi-circular shape in radial cross-section and provided frontally on the radially outermost edge of bush 5, on the same side of cup-shaped seat portion 3a.

Seat 205 and o-ring shaped edge 204 are moreover so shaped to let the latter to snap-on fit inside the former in order to axially lock sealing assembly 200 to bush 5 in place of crimped portions 105 of FIG. 3. At the same time, o-ring shaped edge 204 fits in fluid-tight manner with seat 205 and cooperates simultaneously, in use, in fluid-tigh manner with the lateral wall of body 6, so rendering o-ring 7 of unit 100 of FIG. 3 unnecessary. Accordingly, bush 5a is shorter than bush 5 in axial direction since it does not need the seat for o-ring 7.

Figure 6:
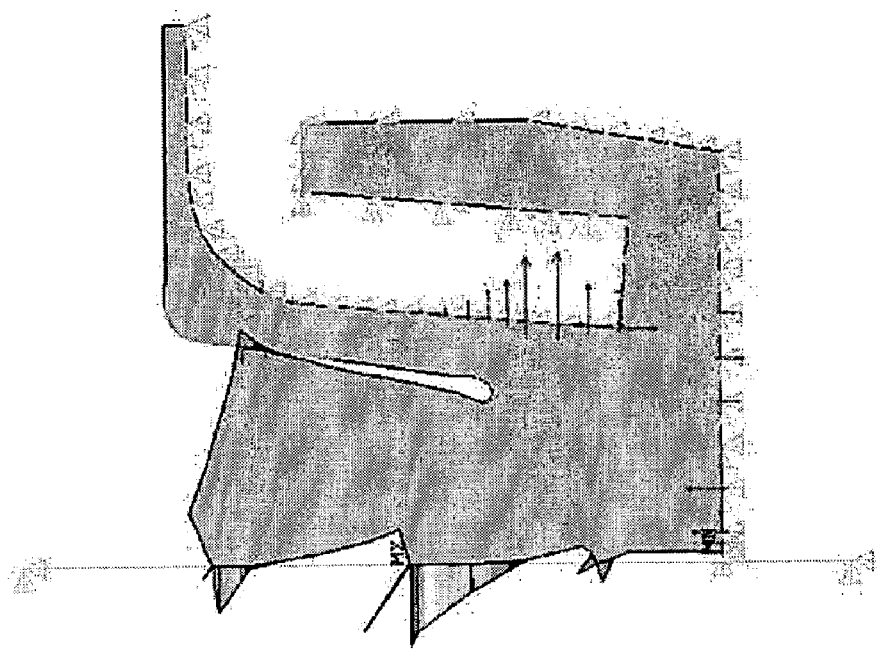
FIGS. 5 to 8 are graphics showing the stress distribution according to a FEM analysis in a sealing assembly according to the invention under different operating pressures.
Figure 5:
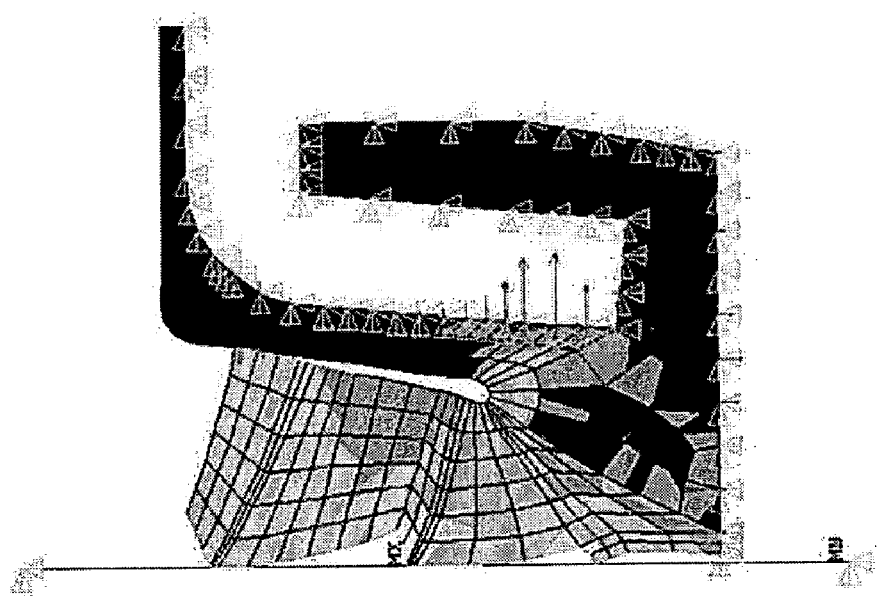
Figure 8:
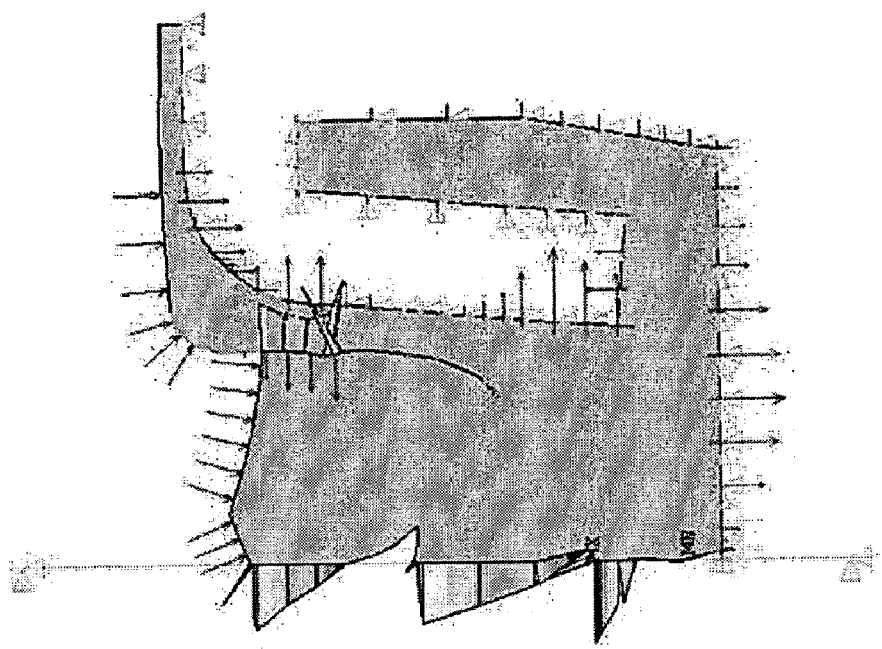
Figure 7:
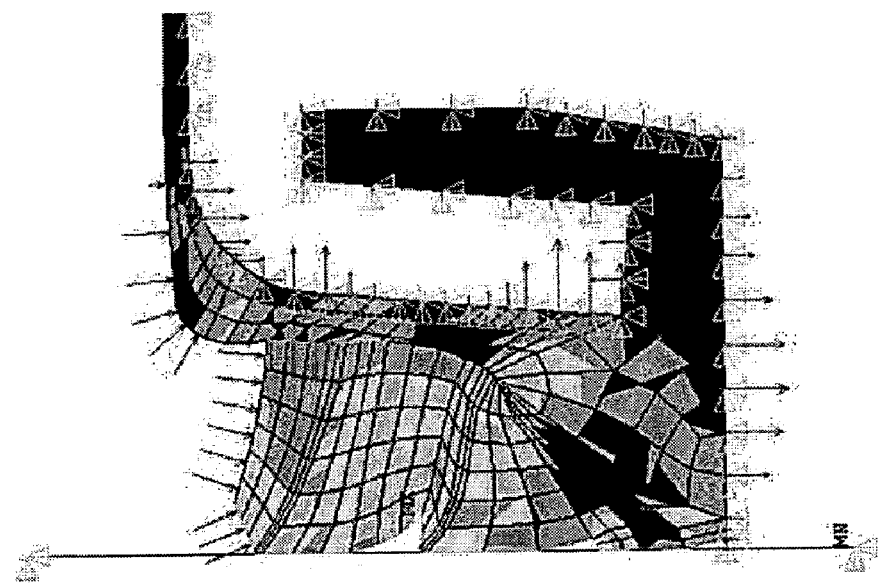

Making now reference to FIGS. 5 to 8, it is clearly shown the advantage surprisingly reached by the sealing assembly structure as described previously. FIGS. 5 and 6 show a FEM analysis of the stress distribution in the sealing assembly 1 of FIG. 3 when assembled in a shock adsorber subjected to no pressure loads (oil pressure inside the shock adsorber equal to zero); in particular, FIG. 5 shows the stress distribution inside the sealing ring 10 and especially within its sealing lip 11 and FIG. 6 shows the stress distribution in the sealing edges 50,51,52 of sealing lip 11. FIGS. 7 and 8 show FEM analysis of the same details of FIGS. 5 and 6 but with the shock adsorber subjected to the maximum nominal pressure load (oil pressure inside the shock adsorber equal to 20 bar).

As it can be seen, the stresses are uniformly distributed both within the whole sealing ring 10 and towards reinforcing structure 20, forming a sort of "nodal" point just in correspondence with the root portion of sealing lip 10. Moreover, the stresses in correspondence with sealing edges 50, 51, 52 are more than well distributed in a linear fashion, ensuring optimal sealing performances. The particular stress distribution under pressure shown allows therefore very good sealing performances to be maintained even at extremely low temperature, well below −15° C.

The invention claimed is:

1. A sealing assembly insertable between a first member and a second member, which are movable relative to one another in use, said sealing assembly comprising:
 a sealing ring made of an elastomeric material and having, integrally in one piece, at least one elastically deformable, annular sealing lip, at least part of which projects axially from and radially inwards of the sealing ring, from a root portion immediately adjacent to a first axial end of the sealing ring, and towards a second axial end, opposite the first axial end, of the sealing ring; and
 an annular reinforcing structure made of a material which is at least partly elastically deformable but more rigid than the elastomeric material of the sealing ring and the sealing lip, said reinforcing structure being at least partly embedded in the sealing ring;
 wherein the reinforcing structure extends at least partly in an axial direction, at least partly alongside the sealing lip; the sealing lip being designed to define, when undeformed, a predetermined radial clearance between itself and a radially inner lateral wall of the sealing ring; said reinforcing structure comprises a sleeve portion extending axially from said second axial end of the sealing ring towards the first axial end and terminating near said root portion of the sealing lip such that the root portion and said first axial end of the sealing ring have no reinforcing structure; and
 wherein said reinforcing structure has a substantially L-shaped radial section, and also comprises a flange portion, which extends radially, on the opposite side to said radially inner lateral wall of the sealing ring, from a first end of the sleeve portion flush with said second axial end of the sealing ring.

2. A sealing assembly as claimed in claim 1, wherein said flange portion of the reinforcing structure is not embedded in the sealing ring, and projects radially from, and substantially flush with, said second axial end of the sealing ring to define radially, on the outside of the sealing ring, an annular axial shoulder by which to assemble the sealing assembly.

3. A sealing assembly as claimed in claim 1, wherein said annular sealing lip projects axially from the first axial end of the sealing ring by such a length as to terminate just short of said second axial end of the sealing ring; said annular sealing lip having a number of radially inner sealing edges, which, in radial section, are serrated in shape and decrease in size towards said root portion.

4. A sealing assembly as claimed in claim 1, wherein said sealing ring comprises a second elastically deformable sealing lip in the form of a dust lip, and which projects axially from said first axial end of the sealing ring and on the opposite side to said second axial end of the sealing ring.

5. A hydraulic sealing and guide unit for a rod of a one-pipe shock absorber, comprising a rod guide bush, which is fixed, in use, in fluidtight manner to an inner lateral wall of a body of the shock absorber; and a sealing assembly which is fitted inside a seat portion of a guide seat formed through the rod guide bush, said seat portion being formed in a first end of the bush facing inwards of the shock absorber body in use; said sealing assembly comprising a sealing ring made of an elastomeric material and having, integrally in one piece, at least one elastically deformable, annular sealing lip, at least part of which projects axially and radially inwardly from the sealing ring, from a root portion immediately adjacent to a first axial end of the sealing ring, and towards a second axial end, opposite the first axial end, of the sealing ring; and an annular reinforcing structure made of a material which is at least partly elastically deformable but more rigid than the elastomeric material of the sealing ring and the sealing lip, said reinforcing structure being at least partly embedded in the sealing ring;

wherein the reinforcing structure extends at least partly in an axial direction, at least partly along side the sealing lip; the sealing lip being designed to define, when undeformed, a predetermined radial clearance between itself and a radially inner lateral wall of the sealing ring; said reinforcing structure comprises a sleeve portion extending axially from said second axial end of the sealing ring towards the first axial end and terminating substantially at said root portion of the sealing lip, such that the root portion and said first axial end of the sealing ring have no reinforcing structure.

6. A hydraulic sealing and guide unit as claimed in claim 5, wherein said sealing assembly is locked axially inside the seat portion by crimping a peripheral edge of said seat portion facing said first end of the bush.

7. A hydraulic sealing and guide unit as claimed in claim 5, wherein said sealing assembly is locked axially inside the seat portion by snap-on fitting it on said bush in a fluid-tight manner by means of a flat portion of the sealing ring extending radially from said second end thereof and terminating with an outermost radially peripheral thicker edge so as to provide a fluid-tight fit in use on a radially outer side, with an inner surface of a body of the shock absorber and projecting axially from said flat portion on a side facing said first end of the sealing ring and in such a manner to cooperate in use in a fluid-tight manner with a lateral wall of the shock adsorber body.

8. A one-pipe shock absorber with a sealing assembly having a hydraulic sealing and guide unit with a sealing assembly as claimed in claim 5.

9. A unit as claimed in claim 5, wherein the sealing ring further comprises a radially outer lateral wall located at a predetermined radial distance from the sleeve portion, so as to define, with the sleeve portion and said first axial end of the sealing ring, a static sealing portion of the sealing ring, said static sealing portion being interference-fitted to said seat portion.

10. A unit as claimed in claim 5, wherein said sleeve portion of the reinforcing structure extends alongside said radially inner lateral wall of the sealing ring, and is embedded completely in the sealing ring.

11. A unit as claimed in claim 5, wherein said sleeve portion has a radially inner surface, at least part of which is not embedded in the sealing ring, so as to define at least part of the radially inner lateral wall of the sealing ring.

12. A unit as claimed in claim 5, wherein said sleeve portion of the reinforcing structure is slightly conically symmetrical, tapering towards the first axial end of he sealing ring.

13. A unit as claimed in claim 5, wherein, in radial section, said annular sealing lip slopes slightly away from said radially inner lateral wall of the sealing ring towards the second axial end of the sealing ring, and has a decreasing radial thickness towards said root portion.

14. A unit as claimed in claim 5, wherein said reinforcing structure has a substantially L-shaped radial section, and also comprises a flange portion, which extends radially, on the opposite side to said radially inner lateral wall of the sealing ring, from a first end of the sleeve portion flush with said second axial end of the sealing ring.

15. A unit as claimed in claim 14, wherein said flange portion of the reinforcing structure is not embedded in the sealing ring, and projects radially from, and substantially flush with, said second axial end of the sealing ring to define radially, on the outside of the sealing ring, an annular axial shoulder by which to assemble the sealing assembly.

16. A unit as claimed in claim 5, wherein said annular sealing lip-projects axially from the first axial end of the sealing ring by such a length as to terminate just short of said second axial end of the sealing ring; said annular sealing lip having a number of radially inner sealing edges, which, in radial section, are serrated in shape and decrease in size towards said root portion.

17. A unit as claimed in claim 5, wherein said sealing ring comprises a second elastically deformable sealing lip in the form of a dust lip, and which projects axially from said first axial end of the sealing ring and on the opposite side to said second axial end of the sealing ring.

* * * * *

UNITED STATES PATENT AND TRADEMARK OFFICE
CERTIFICATE OF CORRECTION

| | | |
|---|---|---|
| PATENT NO. | : 8,127,902 B2 | |
| APPLICATION NO. | : 12/005418 | |
| DATED | : March 6, 2012 | |
| INVENTOR(S) | : Roberto Pasino | |

It is certified that error appears in the above-identified patent and that said Letters Patent is hereby corrected as shown below:

ON THE TITLE PAGE:

Item (73) Assignee: should be corrected from "Aktiebolaget KSF" to AKTIEBOLAGET SKF.

Signed and Sealed this
Seventh Day of August, 2012

David J. Kappos
*Director of the United States Patent and Trademark Office*